United States Patent [19]

Pansana

[11] Patent Number: 4,488,931
[45] Date of Patent: Dec. 18, 1984

[54] PROCESS FOR THE SELF-ALIGNMENT OF A DOUBLE POLYCRYSTALLINE SILICON LAYER IN AN INTEGRATED CIRCUIT DEVICE THROUGH AN OXIDATION PROCESS

[75] Inventor: Pierangelo Pansana, Muggio, Italy

[73] Assignee: SGS-ATES Componenti Elettronici S.p.A., Agrate Brianza, Italy

[21] Appl. No.: 593,238

[22] Filed: Mar. 26, 1984

[30] Foreign Application Priority Data

Mar. 31, 1983 [IT] Italy ............................. 20391 A/83

[51] Int. Cl.³ ..................... H01L 21/306; B44C 1/22; C03C 15/00; C03C 25/06
[52] U.S. Cl. ..................................... 156/643; 29/571; 29/580; 148/187; 156/653; 156/657; 156/659.1; 156/662; 357/23; 357/59
[58] Field of Search ............ 156/643, 653, 657, 659.1, 156/661.1, 662; 29/571, 580, 576 B; 148/1.5, 187; 357/23, 41, 52, 59, 24

[56] References Cited

U.S. PATENT DOCUMENTS

| | | |
|---|---|---|
| 4,142,926 | 3/1979 | Morgan . |
| 4,190,466 | 2/1980 | Bhattacharyya et al. ........ 156/662 X |
| 4,234,362 | 11/1980 | Riseman ........................ 156/662 X |
| 4,239,559 | 12/1980 | Ito ................................. 156/662 X |

Primary Examiner—William A. Powell
Attorney, Agent, or Firm—Wenderoth, Lind & Ponack

[57] ABSTRACT

On a substrate of monocrystalline silicon there are formed, one after another, a first oxide layer, a first polycrystalline silicon layer, a second intermediate oxide layer and a second polycrystalline silicon layer which is thicker than the first. In the second polycrystalline silicon layer there is defined a structure having the desired circuit configuration. Using this polycrystalline silicon structure as a mask, the exposed parts of the intermediate oxide layer are etched until they are completely eliminated and, subsequently, an oxidation process is carried out long enough to completely convert the exposed parts of the first polycrystalline silicon layer into an oxide. Thus, from this layer is obtained a circuit structure which is self-aligned with the first structure defined in the second polycrystalline silicon layer.

10 Claims, 4 Drawing Figures

PROCESS FOR THE SELF-ALIGNMENT OF A DOUBLE POLYCRYSTALLINE SILICON LAYER IN AN INTEGRATED CIRCUIT DEVICE THROUGH AN OXIDATION PROCESS

BACKGROUND OF THE INVENTION

This invention relates to processes for the fabrication of integrated circuit devices comprising double polycrystalline silicon layers, more particularly to processes for obtaining circuit structures with two self-aligned polycrystalline silicon layers in MOS (Metal Oxide Semiconductor)-type integrated circuits. As a rule, such double polycrystalline silicon layers are produced by first forming a continuous oxide layer on a polycrystalline silicon substrate, and then forming on the oxide layer, one after another, a first polycrystalline silicon layer, an intermediate oxide layer, and a second polycrystalline silicon layer. "Two-level" polycrystalline silicon circuit structures can then be obtained therein to form memory storage cells, capacitors, interconnecting lines and other circuit elements. Some of these structures then call for a high degree of alignment between the two polycrystalline silicon layers; this is, for instance, indispensable for the polycrystalline silicon gates of memory storage cells.

A common process used to produce structures with two aligned polycrystalline silicon layers, and which we may consider as the nearest prior art method to that of the present invention, is described in U.S. Pat. No. 4,142,926 to Morgan.

According to the Morgan process, the double polycrystalline silicon layer is formed in the usual manner, but only one of the two polycrystalline layers is doped appropriately.

Using conventional masking and etching techniques, a structure having the desired circuit configuration is defined in the second polycrystalline silicon layer; this structure forms the upper level of the desired two-level circuit structure.

This upper polycrystalline silicon structure is used as a mask in a subsequent etching operation for the elimination of the remaining exposed parts of the intermediate oxide layer.

Thereafter, the exposed parts of the first polycrystalline silicon layer are also etched until they are completely eliminated by an etching operation that acts selectively on the first layer only, precisely because of the fact that one of the two polycrystalline silicon layers is doped, while the other is not.

In this operation, the same structure formed in the second polycrystalline silicon layer, which is left unaltered or nearly so by the etching, acts as a mask; thus, a circuit structure is obtained in the first underlying polycrystalline silicon layer which is automatically self-aligned with that of the second layer with which it forms the desired two-level circuit structure.

This process is used mainly for the fabrication of programmable read-only memories (PROMs), comprising MOS-type floating-gate field-effect memory devices.

The upper gate of the device is obtained from the second polycrystalline silicon layer by masking the gate and by subsequent etching of the polycrystalline silicon not protected by the mask. This is followed by the elimination of the exposed parts of the intermediate oxide layer which, in turn, is followed, as stated above, by the etching of the first polycrystalline silicon layer by means of a reagent that acts selectively only on the first polycrystalline silicon layer in the parts where the latter is exposed.

The lower gate of the storage device is formed in this manner, so that it is automatically aligned with the upper gate.

Thereupon, using prior art implanting, depositing and diffusing techniques, a source region and a drain region, which are located adjacent to the gate region, are formed in the substrate through windows that have been opened in the lower oxide layer.

The process described above enables the self-alignment of the two-level polycrystalline silicon circuit structures, but it also has disadvantages that cannot be overlooked whenever one desires to reduce the integrated circuit device areas to a minimum.

As is well known, selective etchings of the type in use today are of the isotropic type so that, by acting on the polycrystalline silicon of the first layer with equal energy in all directions, it not only eliminates therefrom the parts not protected by the overlying oxide and polycrystalline mask of the second layer, but it also etches the edge of the protected parts, forming an undercut beneath the oxide. Therefore, the area of the "self-aligned" structure made out of the first polycrystalline silicon layer is, in reality, smaller than that of the structure of the second layer.

The difference between the areas, expressed as a percentage, is more significant as the area of the overall structure is decreased, and it constitutes an unnecessary loss of the available area used for the integrated circuit device.

For example, in the case of storage cells in which the capacitive effect between the two polycrystalline silicon layers is utilized for storing and transferring the data as voltages, a harmful reduction of the effective area of the capacitor formed by the gates results. Therefore, whenever integration techniques are adopted that involve the same type of doping of both of the polycrystalline silicon layers, the above noted process can no longer be used, since it is based on a selective etching which is dependent upon the doping of only one of the two layers.

At this point it should be noted that it is not possible to plasma etch the polycrystalline silicon of the first layer, since there is a danger that the exposed monocrystalline silicon would be etched excessively and the other parts of the device contaminated.

SUMMARY OF THE INVENTION

The major object of this invention is to create a process for the self-alignment of a double polycrystalline silicon layer in an integrated circuit device that could be utilized even if neither layer is doped, or if these layers have the same type of doping and which, compared with the prior art processes, would permit further reduction of the areas of the integrated circuit device. This object is achieved by the process defined and characterized in the appended claims.

BRIEF DESCRIPTION OF THE DRAWINGS

The invention will be better understood from the following detailed description given solely by way of non-limitative example in conjunction with the accompanying drawings, in which.

DESCRIPTION OF THE PREFERRED EMBODIMENT

Figure 1:
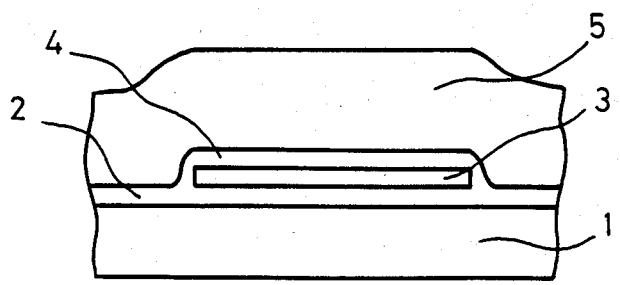
FIGS. 1, 2, 3 and 4 represent, in a vertical cross-section, a greatly enlarged part of a field-effect MOS-type storage device produced by the process embodying the invention during several sequential phases of its formation.

The process taught by the present invention also includes the usual steps of forming a double polycrystalline silicon layer which consists of the successive formation, on a monocrystalline silicon substrate, of a first oxide layer, a first polycrystalline silicon layer, a second oxide layer and, finally, a second polycrystalline silicon layer.

According to the present invention, the second polycrystalline silicon layer shall have a thickness greater than that of the first polycrystalline silicon layer. Using prior art masking and etching techniques either of a chemical or plasma type, a structure having the desired circuit configuration is defined in the upper polycrystalline silicon layer.

Following elimination of the other portions of the layer, the structure itself is used as a protective mask for the etching and for the complete elimination of the exposed portions of the underlying oxide layer.

Unlike the prior art processes, which at this point includes a selective etching, the process of the invention comprises an oxidation phase for the complete conversion of the remaining exposed portion of the first polycrystalline silicon layer into oxide. In this way, only the protected portion remains of the first polycrystalline silicon layer that forms a circuit structure that is automatically aligned with that obtained in the second polycrystalline silicon layer (which is only reduced during oxidation), with which it forms the desired two-level circuit structure.

This two-level circuit structure is already completely protected by the oxide layer obtained with the oxidizing operation. However, this oxide layer can subsequently be eliminated, in whole or in part, to create more complex integrated elements with further operations, using techniques already known to those skilled in the art.

The advantage of using an oxidizing operation in place of an etching operation essentially results in a better and more effective self-alignment, as can be verified experimentally, and also results in an improved process controllability and reproducibility, with a lesser danger of possible contamination.

Described below in detail is one of the possible embodiments of the process of the present invention which is suited to the fabrication of field-effect MOS-type memory storage devices. The various phases of the process, all of which are carried out in accordance with standard prior art techniques, will be described in conjunction with the figures of the accompanying drawing, in which like reference numerals denote like parts throughout the figures.

Now, referring to FIG. 1, the following operations are carried out:

a thin oxide layer 2 having a thickness of about 700 Å and forming the first oxide of the storage cell gate is formed on a monocrystalline silicon substrate 1 doped with P-type impurities (e.g. boron);

a first thin polycrystalline silicon layer 3 doped with N-type impurities (phosphorus or arsenic) and having a thickness of about 1,000 Å is formed on the oxide layer;

a second thin oxide layer 4 having a thickness of about 800 Å, and forming the second oxide of the storage cell gate is formed on layer 3; and a second polycrystalline silicon layer 5 having a thickness of about 5,500 Å and also being doped with N-type impurities is formed on oxide layer 4.

Figure 2:
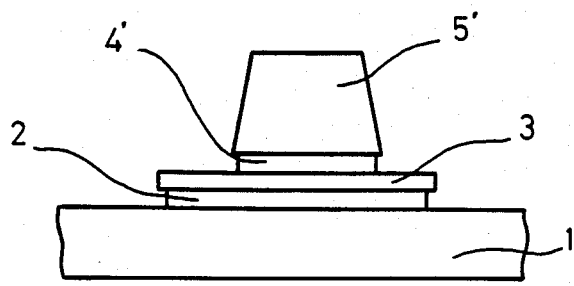

Now, with reference to FIG. 2, the following operations are carried out:

a protective mask is formed on several zones of the second upper polycrystalline silicon layer 5 using prior art photolithographic techniques;

the device is plasma etched until the unprotected portions of the second upper polycrystalline silicon layer 5 are completely eliminated in order to define the upper gate 5' of the memory storage cell;

the device is etched to eliminate the exposed portions of the intermediate oxide layer 4;

the device is then etched to remove the protective mask.

Figure 3:
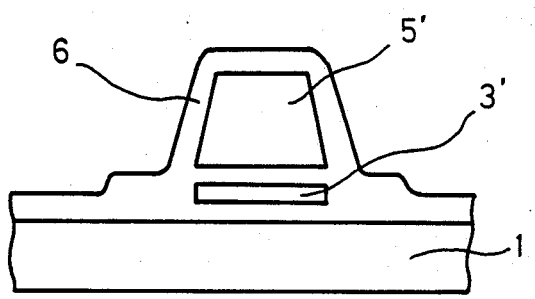

As indicated in FIG. 3, the following basic operation is then carried out:

the device is oxidized until the exposed portions of the first polycrystalline silicon layer 3 are completely converted into an oxide 6. It is most important to note that the upper portion of the polycrystalline silicon mask 5' is also converted into an oxide 6, but since the second layer 5' has been made much thicker than the layer 3, a sufficient portion of the layer 5' remains polysilicon. In this way, a lower gate 3', which is self-aligned with the upper gate 5', is obtained.

Figure 4:
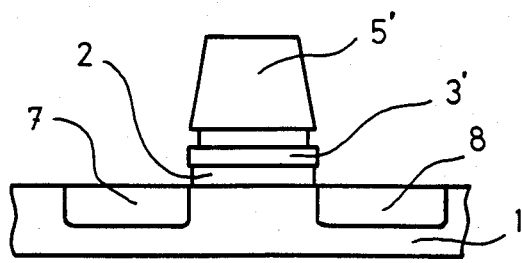

Now, referring to FIG. 4, the operations required for the completion of the field-effect device are then performed:

complete elimination, in the pre-established areas, of oxide 6 and oxide 2 by etching;

masking of source and drain; and ionic implantation of N-type impurities in the semiconductor substrate 1 (e.g. arsenic, in doses of $5 \times 10^{15}$ ions/cm$^2$ and an implantation energy E=50 KeV) to form the source 7 and drain 8 regions of the memory storage cell.

The process continues with the usual phases of the deposition of a protective "P-Vapox" layer and the opening of contacts, the deposition and delineation of the interconnecting aluminum-silicon layer, the covering with the final passivation layer, and the opening of the external contact areas ("pads").

While only one specific embodiment of the process according to the invention has been illustrated and described herein, it will be understood that numerous variations are possible without departing from the scope of the invention.

For example, instead of performing—immediately after the oxidizing operation for the complete conversion into oxide of the exposed parts of the first polycrystalline silicon layer 3—the operations for the complete elimination, in the pre-established areas, of oxides 6 and 2, the masking of the source and drain, and the ionic implantation of N-type impurities to form the source 7 and drain 8 regions, there can be carried out—following the operation for the elimination of the exposed portions of the intermediate oxide layer 4 and prior to the oxidation process for the complete conversion of the exposed portions of the first polycrystalline silicon layer 3 into oxide—an operation for the implantation of N-type impurities (phosphorus, with doses of about $5 \times 10^{15}$ ions/cm$^2$) with an energy (about 180 KeV) which is sufficient to form in the substrate 1, through the exposed portions of the first polycrystalline silicon layer 3 and the underlying oxide, the desired source 7 and drain 8 regions of the storage cell.

I claim:

1. A process for fabricating an MOS-type integrated circuit structure having a double self-aligned polycrystalline silicon layer on a predetermined area of a silicon substrate, comprising the steps of:

forming a first continuous silicon dioxide layer on said predetermined area of said substrate;

forming a first polycrystalline silicon layer on said first silicon dioxide layer such that it is insulated from said substrate at least in said predetermined area of said substrate;

forming a second silicon dioxide layer on said first polycrystalline silicon layer;

forming a second polycrystalline silicon layer on said second dioxide layer;

forming an upper structure in said predetermined area having a pre-established configuration by removing predetermined portions of said second polycrystalline silicon layer;

removing exposed portions of said second silicon dioxide layer;

wherein said second polycrystalline silicon layer is formed such that its thickness in said predetermined area is greater than that of said first polycrystalline silicon layer, and wherein said process also comprises an oxidizing operation for forming a lower structure which is self-aligned with said upper structure by converting exposed portions of said first polycrystalline silicon layer into silicon dioxide, utilizing said upper structure as a mask during said oxidizing operation.

2. A process as set forth in claim 1, wherein at least one of said two polycrystalline silicon layers is doped with phosphorus.

3. A process as set forth in claim 1, wherein at least one of said two polycrystalline silicon layers is doped with arsenic.

4. A process as set forth in claim 1, wherein said first polycrstalline silicon layer has a thickness of about 1,000 Å and said second polycrystalline silicon layer has a thickness of about 5,500 Å.

5. A process for fabricating an MOS-type floating-gate memory storage device on a predetermined area of a silicon substrate, comprising the steps of:

forming a first continuous silicon dioxide layer on said predetermined area of said substrate;

forming a first polycrystalline silicon layer on said first silicon dioxide layer such that it is insulated from said substrate at least in said predetermined area;

doping said first polycrystalline silicon layer with a first type of impurity;

forming a second silicon dioxide layer on said first polycrystalline silicon layer;

forming a second polycrystalline silicon layer on said second dioxide layer, said second polycrystalline silicon layer being doped with said same first type of impurity as said first polycrystalline silicon layer;

forming an upper gate by removing predetermined portions of said second polycrystalline silicon layer; and removing the exposed portions of said second silicon dioxide layer, wherein said second polycrystalline silicon layer is formed such that its thickness in said predetermined area is greater than that of said first polycrystalline silicon layer, and wherein said process also comprises an oxidation process for forming a lower gate which is self-aligned with the upper gate by converting said exposed portions of said first polycrystalline silicon layer into silicon dioxide, using said upper gate as a mask during said oxidizing process.

6. A process as set forth in claim 5, further comprising the steps of forming a source region and a drain region which are adjacent to said lower gate.

7. A process as set forth in claim 6, wherein both of said polycrystalline silicon layers are doped with phosphorus.

8. A process as set forth in claim 6, wherein both of said polycrystalline silicon layers are doped with arsenic.

9. A process as set forth in claim 7, wherein said source and drain regions comprise N-type regions.

10. A process as set forth in claim 8, wherein said source and drain regions comprise N-type regions.

* * * * *